(12) United States Patent
Ku et al.

(10) Patent No.: US 6,391,737 B1
(45) Date of Patent: May 21, 2002

(54) METHOD OF SIMULTANEOUSLY FORMING PATTERNS ON A DIE OF AN ALIGNMENT MARK AND OTHER DIES

(75) Inventors: Chin-Yu Ku, Hsinchu; Hsiang-Wei Tseng, Taichung, both of (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/606,751

(22) Filed: Jun. 29, 2000

(51) Int. Cl.$^7$ ............................................. H01C 21/76
(52) U.S. Cl. ...................................... 438/401; 257/797
(58) Field of Search ................................ 438/462, 401, 438/691, 694, 700, 975; 257/622, 797

(56) References Cited

U.S. PATENT DOCUMENTS 6,071,656 A * 6/2000 Lin ............................... 430/22
6,239,031 B1 * 5/2001 Kepler et al. ............... 438/692
6,239,858 B1 * 5/2001 Tomimatu .................... 355/18

* cited by examiner

*Primary Examiner*—David Nelms
*Assistant Examiner*—Quoc Hoang
(74) *Attorney, Agent, or Firm*—J.C. Patents

(57) ABSTRACT

A method of manufacturing semiconductor devices. An alignment mark is formed in any one of the dies in a substrate. A waiting-for-patterning layer is formed over the dies. A negative photoresist layer is formed over the waiting-for-patterning layer. A first exposure is carried out so that a plurality of first exposed regions is formed in all the dies of the chip. A second exposure is carried out to form a second exposed region. The second exposed region overlaps with the first exposed region and the unexposed region above the alignment mark and the overlapping region covers the alignment mark region. A photoresist development is conducted to remove the negative photoresist in the unexposed regions. Using the negative photoresist as a mask, a portion of the waiting-for-patterning layer is removed to form a pattern on the waiting-for-patterning layer. The negative photoresist layer is removed.

16 Claims, 10 Drawing Sheets

METHOD OF SIMULTANEOUSLY FORMING PATTERNS ON A DIE OF AN ALIGNMENT MARK AND OTHER DIES

BACKGROUND OF THE INVENTION

1. Field of the Invention

The present invention relates to a method of semiconductor patterning. More particularly, the present invention relates to a method of simultaneously forming patterns on a die of an alignment mark and other dies.

2. Description of the Related Art

Photolithography is a critical process that decides whether or not a semiconductor device can be successfully fabricated. Thus, photography occupies an important position in the semiconductor fabrication process. A common device fabrication process is taken as an example. Usually, according to the complexity of a device, a fabrication process needs 10 to 18 photolithography and exposure steps. In order to precisely transfer the pattern onto the chip, an alignment between layers needs to be performed before each photoresist exposure step. This is in order to avoid incorrect pattern transfer and the consequent chip disposal.

In a traditional exposure process, alignment mark is formed over the chip according to the location of a mask in order to achieve alignment. In order to avoid damage on the alignment mask during semiconductor fabrication, usually no pattern is formed around the alignment mark. However, this causes the oxide layer formed over the empty region around the alignment mark to remain to form a residual oxide layer after performance of chemical mechanical processing.

A fabrication process of a shallow trench isolation is taken as an example. FIGS. 1A through 1C are schematic cross-sectional views showing the progression of steps for producing a conventional shallow trench isolation structure.

As shown in FIG. 1A, a substrate 100 having alignment marks 102 thereon is provided. A mask layer 104 is formed over the substrate 100, and then a photoresist layer 106 is formed over the mask layer 104. Using the mask layer 104 as an etching mask, the mask layer 104 and a portion of the substrate 100 are removed to form a trench 108 in the substrate 100.

As shown in FIG. 1B, the photoresist layer 106 is removed and then a silicon oxide layer 110 is formed over the substrate 100 so that the mask layer 104 is covered while the trench 108 is filled.

As shown in FIG. 1C, a chemical-mechanical polishing operation is carried out to remove redundant silicon oxide material from the silicon oxide layer 110 using the mask layer 104 as a polishing stop layer. Subsequently, a silicon oxide layer 110a is formed inside the trench 108. Lastly, the mask layer 104 is removed.

In general, the density of trenches on a silicon chip is non-uniform and there are some empty regions on the silicon chip free of isolation structures. In the process of removing the oxide material above the mask layer 104 in a chemical-mechanical polishing operation, some of the oxide material above the empty region 112 will be retained to form a residual oxide layer 110b.

To reduce thickness of the residual oxide film on top of empty regions, dummy isolation regions are sometimes formed over the empty regions 112 on the substrate 100 so that a uniform polish can be achieved. FIGS. 2A through 2D are schematic cross-sectional views showing the progression of steps for producing conventional shallow trench isolation structures and dummy isolation regions on empty regions in a substrate.

As shown in FIG. 2A, a photomask having both isolation region pattern 114 and dummy isolation region pattern 116 are used to pattern a photoresist layer 106. After photo-exposure, the patterns are transferred to the photoresist layer 106.

As shown in FIG. 2B, the photoresist layer 106 is developed. Hence, the isolation region pattern 114 and the dummy isolation region 116 are formed in the photoresist layer 106. Using the photoresist layer 106 as an etching mask, the mask layer 104 and the substrate 100 are etched to form trenches 108 in the isolation region as well as dummy trenches 118 in the dummy isolation region.

As shown in FIG. 2C, the photoresist layer 106 is removed and then an oxide layer 110 is formed over the substrate 100. Hence, the mask layer 104 is covered while the trenches 108 and the dummy trenches 118 are filled.

As shown in FIG. 2D, a chemical-mechanical polishing operation is carried out to remove any redundant oxide material above the mask layer 104. The mask layer 104 is also removed to form isolation structures 110a and dummy isolation structures 110c in the substrate 100.

In the aforementioned method, the isolation region pattern 114 and the dummy isolation pattern 116 are formed on the same photoresist layer 106 as shown in FIG. 2A. In carrying out photo-exposure, a pattern on the photomask 400 in FIG. 4 is transferred to each exposure shot 120 in the silicon chip 100 shown in FIG. 3 one by one to form isolation region pattern 114 in the photoresist layer 106 above the substrate (silicon chip) 100. Thereafter, the pattern of the photomask 400 is transferred onto the empty regions 112 around the alignment mark 102. In this manner, the isolation region pattern 114 and the dummy isolation pattern 116 are formed on the same photoresist layer 106.

As shown in FIG. 3, dimensions of shots 122 of the alignment marks 102 above the silicon chip are different from a dimension of the exposure shots 120 in each exposure operation. During an exposure process of dummy isolation region pattern, a corner 404 (for example, the left/upper corner) of the chromium film 402 on the photomask 400 in FIG. 4 is aligned with a corner 130 (for example, the upper/left corner) of an alignment shot 122. In addition, the non-transparent blade 300 of a stepper is used to block a portion of the area on the photomask 400 that corresponds to the alignment mark 102 and a portion of the alignment marking shot 122. Because of the chromium film 402 on the photomask 400 and the non-transparent blade 300 of the stepper, light is permitted to pass in a specified region only. Consequently, trench pattern at the corner 404 of the photomask 400 is transferred to the corner 130 of shot 122 only. To form a complete dummy isolation pattern 116, the photoresist layer 106 at the other corners of the alignment shot 122 must be transferred by carrying out similar steps.

The method demands a multiple of exposures to form a complete dummy isolation pattern 116 in the photoresist layer 106 above the alignment shot 122. Consequently, throughput of the station decreases and wear of the non-transparent blades increases.

In general, the number of exposures can be reduced by placing the alignment mark to one side of the alignment shot rather than the middle and attaching neighboring alignment shots shot-to-shot as shown in the magnified view of FIG. 3. However, by so doing, the chip areas surrounding such alignment marks are likely to be affected by subsequent polishing operations.

SUMMARY OF THE INVENTION

The invention is directed to a method of a forming semiconductor pattern. The method includes dividing a chip into a plurality of first exposure shots and a plurality of second exposure shots. After an alignment mark is formed in one of the dies of a first exposure shot, a waiting-for-patterning layer is formed over the chip. A negative photoresist layer is formed over the waiting-for-patterning layer. First exposure processes are carried out one-by-one to form a plurality of first exposed regions and a plurality of unexposed regions in the negative photoresist above the first exposure shots and the second exposure shots. A second exposure process is next carried out to form a second exposed region in the negative photoresist above the alignment mark. The second exposed region overlaps with the first exposed region and the unexposed region above the self-aligned mark and the overlapping region covers the alignment mark region. A photoresist development is carried out to remove the negative photoresist in the unexposed regions and expose the waiting-for-patterning layer. Using the negative photoresist layer as a mask, the exposed waiting-for-patterning layer is etched to form a pattern. The negative photoresist layer is removed.

This invention also provides a method of forming semiconductor patterns. A substrate having a plurality of dies thereon is provided. The substrate is divided into a plurality of first exposure shots and a plurality of second exposure shots. An alignment mark is formed in one of the dies of a first exposure shot. A mask layer is formed over the substrate and then a negative photoresist layer is formed over the mask layer. First exposure processes are carried out one-by-one to form a plurality of first exposed regions and a plurality of unexposed regions in the negative photoresist layer above the first exposure shots and the second exposure shots individually. The unexposed regions include a plurality of trench pattern. A second exposure process is next carried out to form a second exposed region in the negative photoresist above the alignment mark. The second exposed region overlaps with the first exposed region and the unexposed region above the alignment mark, and the overlapping region covers the alignment mark region. A photoresist development is carried out to remove the negative photoresist in the unexposed regions and expose the mask layer. Using the negative photoresist layer as a mask, the exposed mask layer is removed to form a trench pattern. The negative photoresist layer is removed. Using the patterned mask layer as a mask, a portion of the substrate is removed to form a plurality of trenches in the dies amongst the first exposure shots and the second exposure shots. An insulation layer is formed over the chip to cover the mask layer and fill the trenches. A chemical-mechanical polishing operation is carried out to remove the excess insulating material above the mask layer. The mask layer is removed so that the insulation layer inside each trench of the second exposure shots becomes an isolation region. The insulation layer inside each trench of the second exposure shots becomes a dummy isolation region.

According to the embodiment of this invention, dimensions of the first exposure shots containing the alignment mark are identical to other second exposure shots. Hence, when the aforementioned exposure operation is conducted, the desired pattern of the first exposure shot containing the alignment will emerge as long as the stepper carries out the exposure sequentially. In other words, one exposure needs to be carried out to form the first exposure shot that contains the alignment mark. Compared with the conventional multi-step exposure process, the method of this invention is faster. In addition, this invention is also capable of increasing throughput, reducing non-transparent blade wear and lowering production cost.

In addition, by forming a negative photoresist layer over the substrate, chromium film on photomask for clearing peripheral region can be used to align with the periphery of the alignment mark region. Hence, light can pass through the clearing region and transfer the pattern to the chip so that an exposed region is formed above the alignment mark. Because position and dimensions of the exposed region depend on the chromium blocking layer in the photomask rather than the mask-blocking non-transparent blade in a stepper, optical diffraction can be prevented. Therefore, the pattern on the clearing region of the photomask can be correctly transferred to the photoresist layer.

In this invention, dummy isolation regions are formed around the peripheral region of the alignment mark so that the density of trenches in the first exposure shot with the alignment mark and other second exposure shots are almost identical. Thus, a uniform polishing rate is provided in subsequent chemical-mechanical polishing operation.

Furthermore, whether the alignment mark is in the middle of the chip or on one side close to a die, one exposure is all that is required to form the dummy isolation region pattern around the alignment mark. Consequently, the alignment mark can be positioned in the middle of a die so that the effect of the alignment mark on the peripheral chips is greatly reduced.

Accordingly, the present invention provides a faster exposure process, decreases the fabrication cost, and providing a uniform polishing rate during chemical mechanical polishing. In addition, in the present invention the alignment mark can be positioned in the middle of a die so that the effect of the alignment mark on the peripheral chips is greatly reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
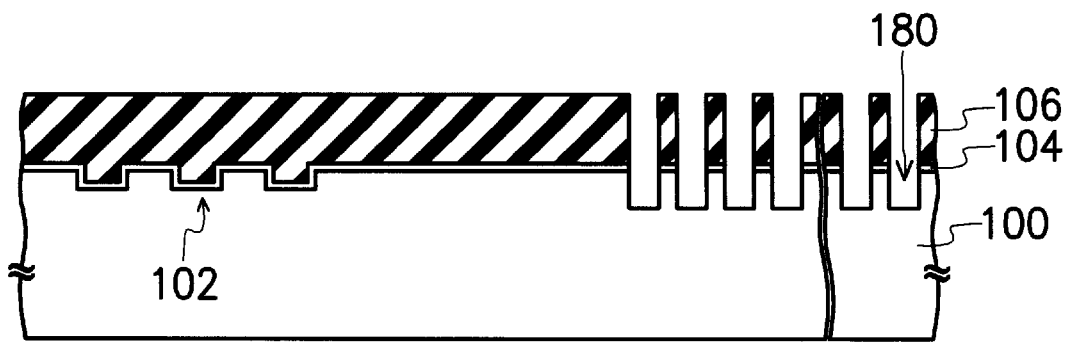
FIGS. 1A through 1C are schematic cross-sectional views showing the progression of steps for producing a conventional shallow trench isolation structure.
Figure 1B:
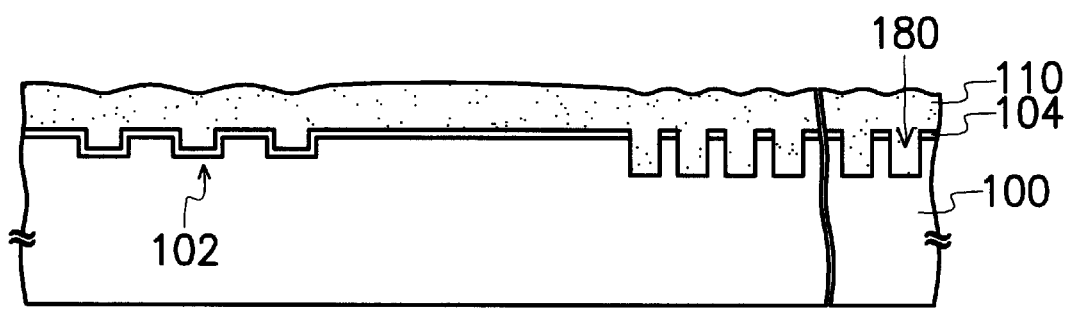
Figure 1C:
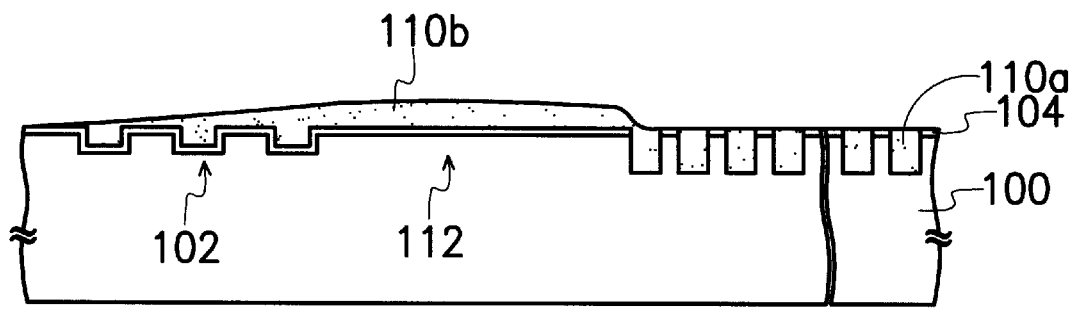
Figure 2A:
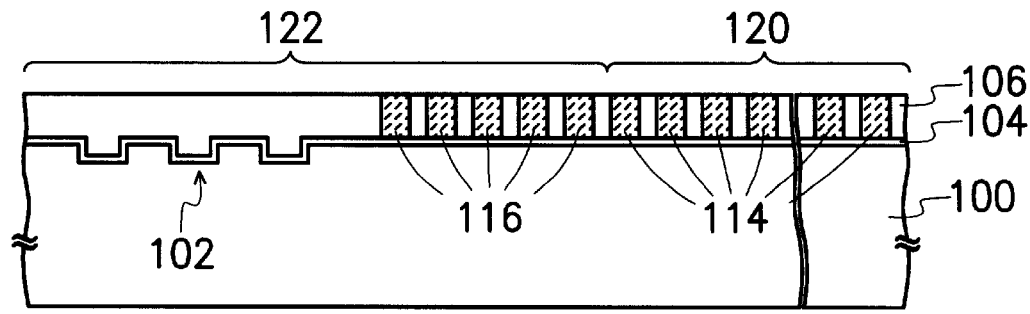
FIGS. 2A through 2D are schematic cross-sectional views showing the progression of steps for producing conventional shallow trench isolation structures and dummy isolation regions on empty regions in a substrate.
Figure 2B:
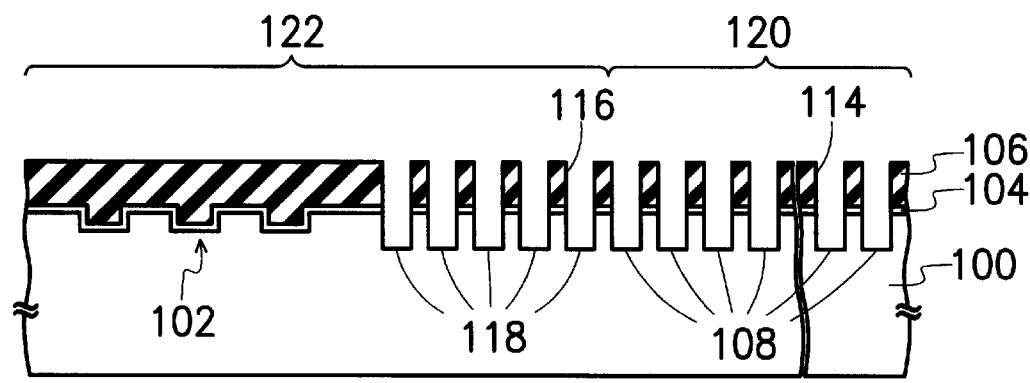
Figure 2C:
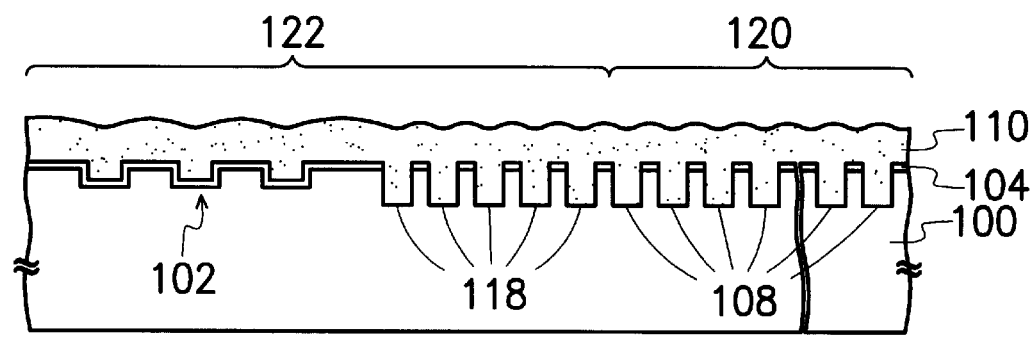
Figure 2D:
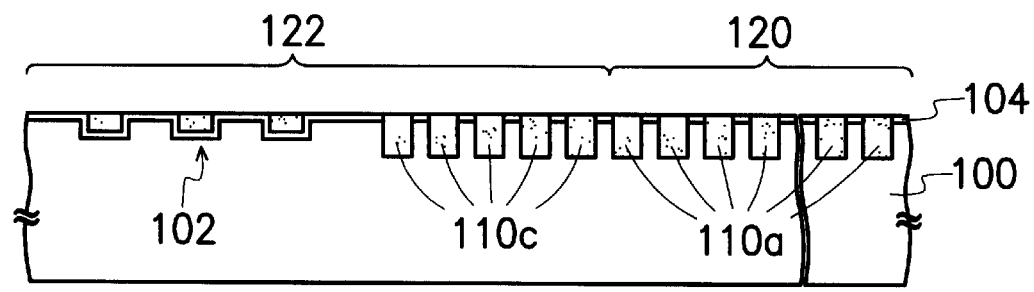
Figure 3:
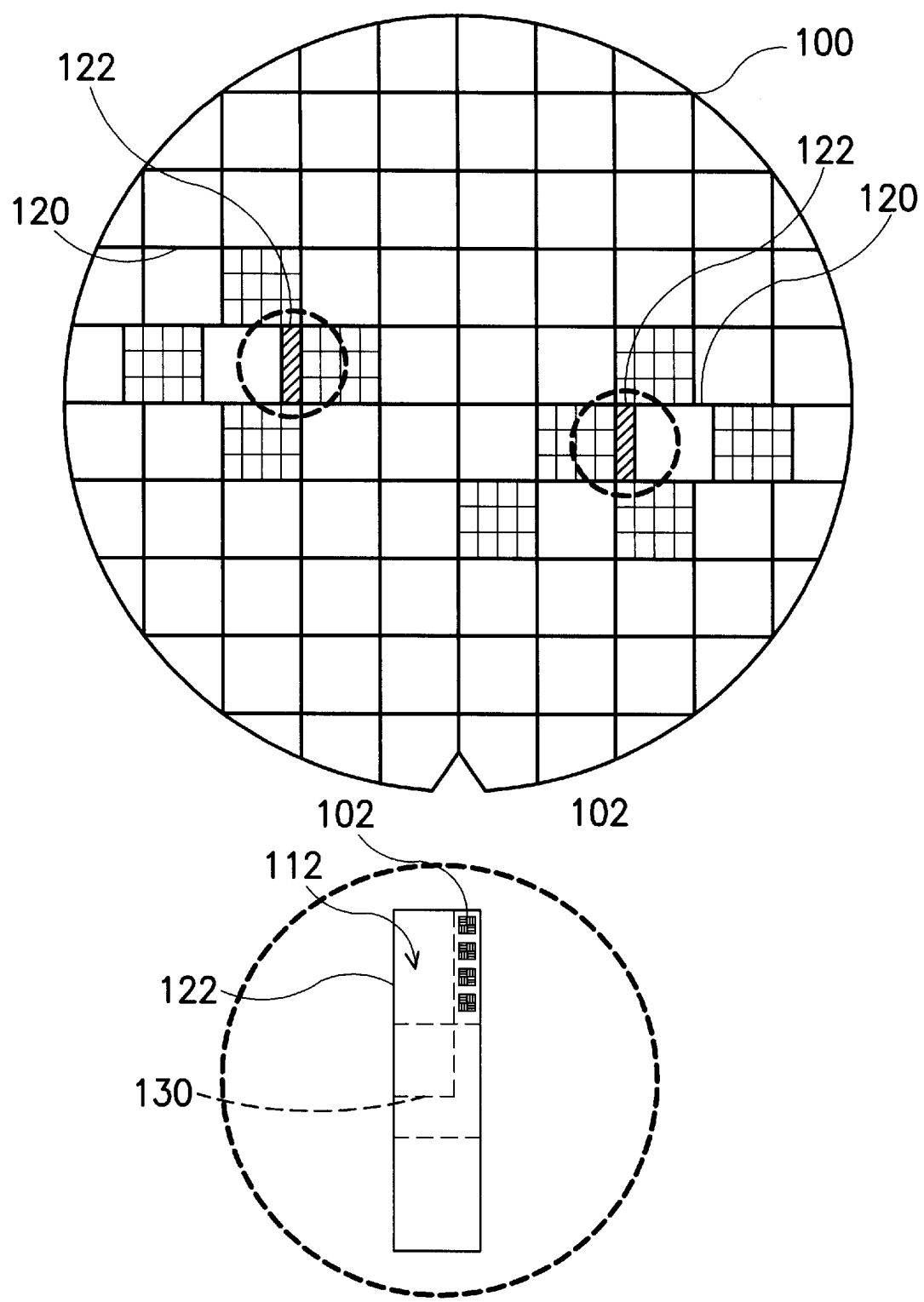
FIG. 3 is a top view of the chip shown in FIGS. 2A through 2D.
Figure 4:
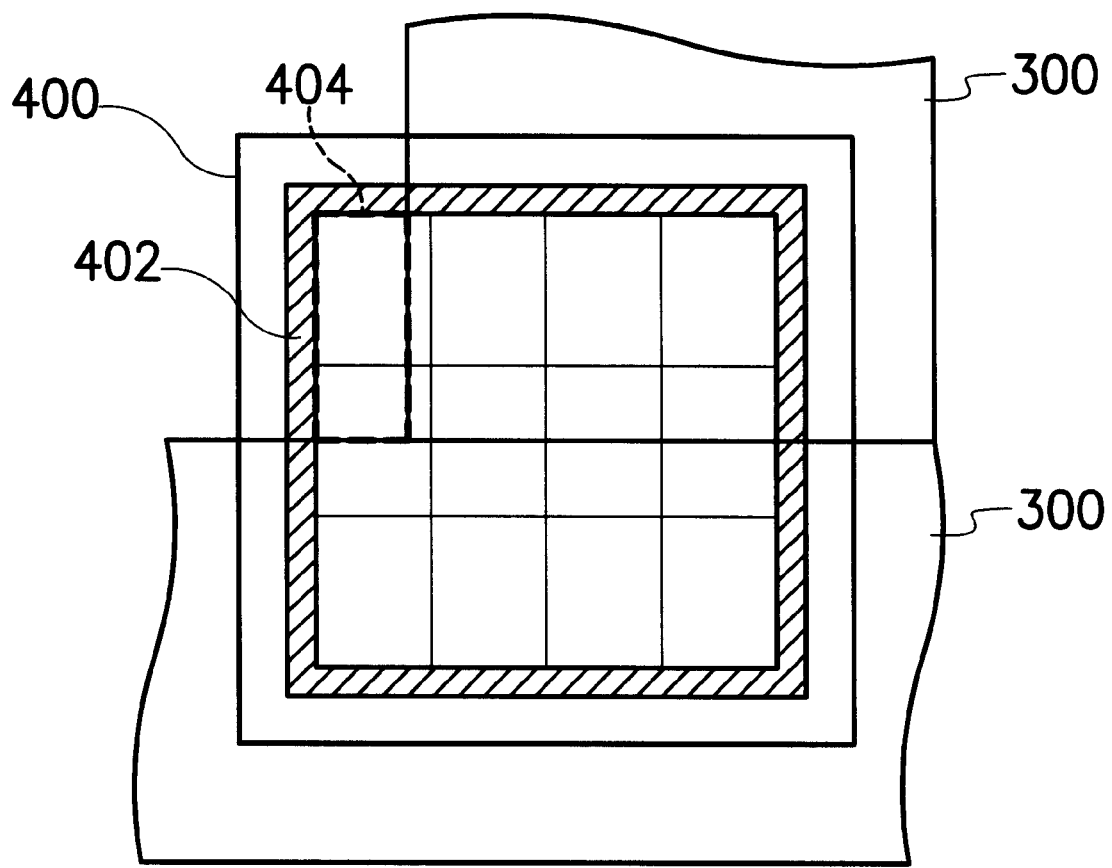
FIG. 4 is a top view of a conventional photomask for patterning out the isolation region in FIG. 2A.

Reference will now be made in detail to the present preferred embodiments of the invention, examples of which are illustrated in the accompanying drawings. Wherever possible, the same reference numbers are used in the drawings and the description to refer to the same or like parts.

The following exemplary steps takes a fabrication process of a shallow trench isolation structure as an example for explaining the present invention of forming the patterns of a die of alignment mark and other dies. However, the application of the present invention is not limited in the fabrication process of a shallow trench isolation structure. FIGS. 5A through 5H are schematic cross-sectional views showing the progression of steps for producing a shallow trench isolation structure according to this invention.

Figure 5A:
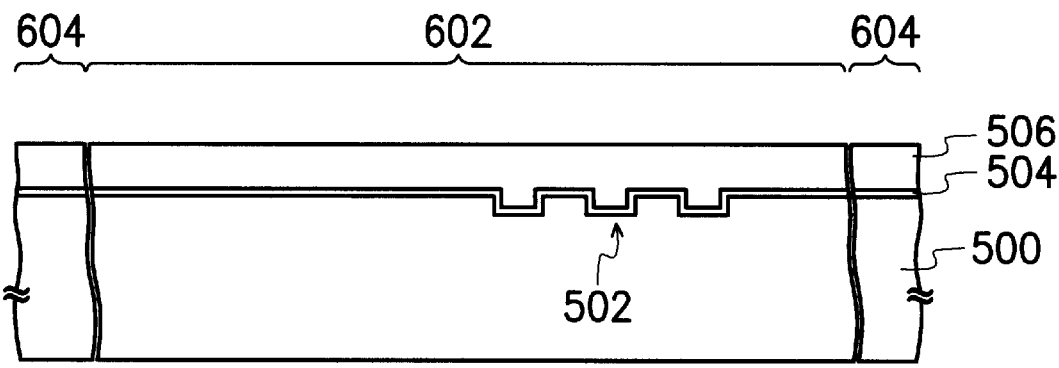
FIGS. 5A through 5H are schematic cross-sectional views showing the progression of steps for producing a shallow trench isolation structure according to this invention.
Figure 6:
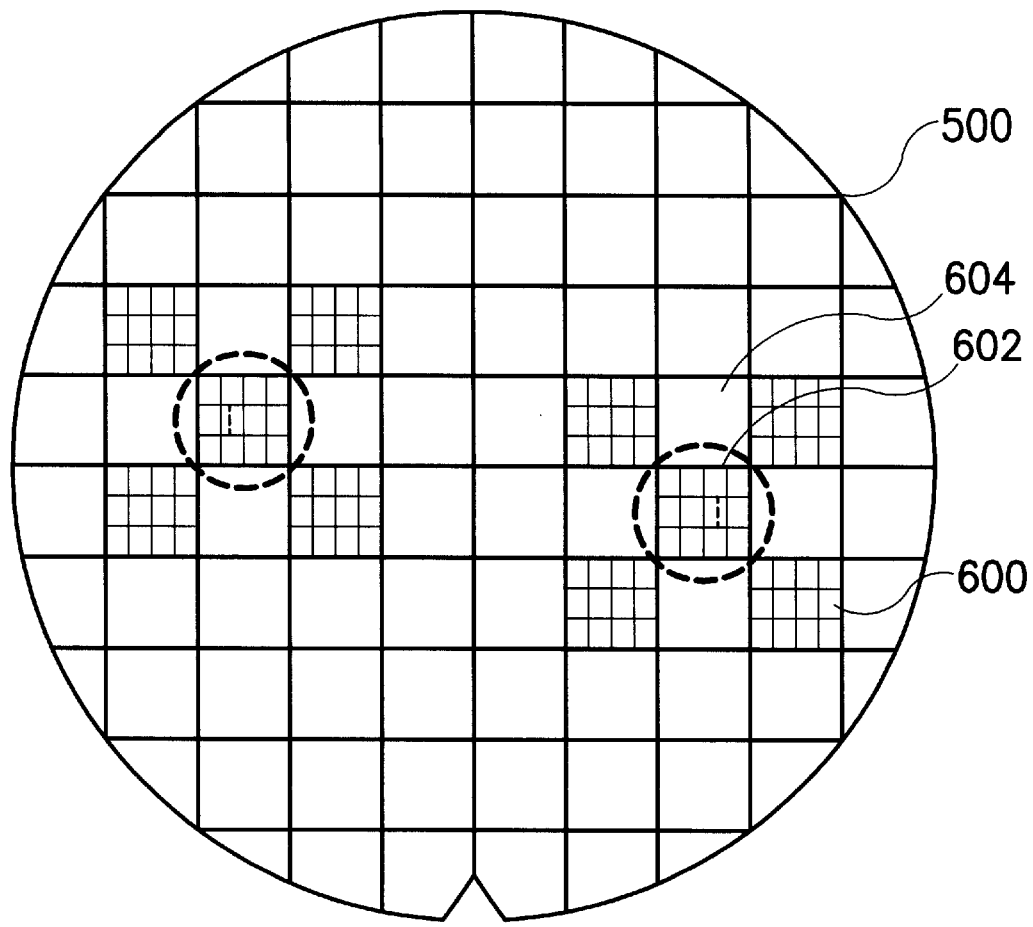
FIG. 6 is a top view of the chip shown in FIGS. 5A through 5H.
Figure 6:
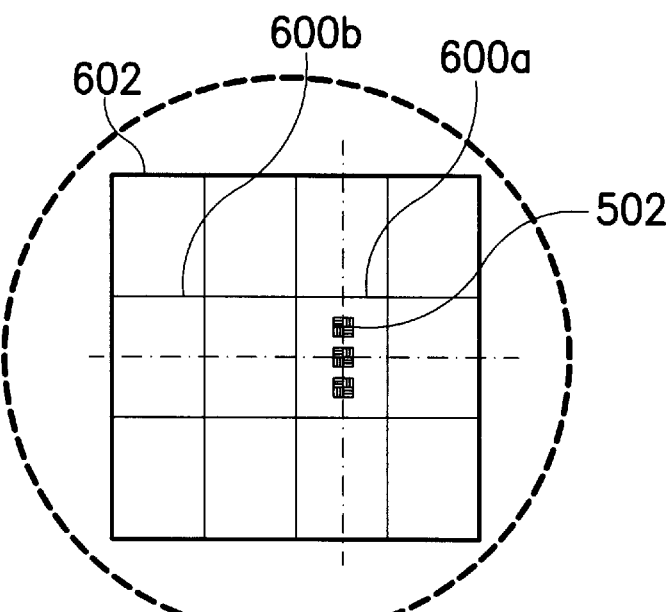

As shown in FIG. 5A, a substrate 500 is provided. The substrate 500 is a chip as shown in FIG. 6. The substrate 500 includes a plurality of dies 600. The dies can be grouped into a plurality of first exposure shots 602 and a plurality of second exposure shots 604. An alignment mark 502 is formed in one of the dies 600a in the first exposure shot 602. Other dies without an alignment mark 502 are labeled 600b. Preferably, the first exposure shots 602 and the second exposure shots 604 have identical dimensions. The alignment mark 502 is preferably formed in the middle of the die 600a inside the first exposure shot 602.

A mask layer 504 is formed over the substrate 500, and then a photoresist layer 506 is formed over the mask layer 504. The mask layer 504 is formed, for example, by carrying out a thermal oxidation to form a pad oxide layer over the substrate 500 followed by performing a chemical vapor deposition to form a silicon nitride layer over the pad oxide layer. The photoresist layer 506 can be a negative photoresist layer, for example. In general, cross-linking of the molecules inside the negative photoresist material will occur after exposure to light. Thus, the unexposed photoresist material can be removed by a developer.

Figure 5B:
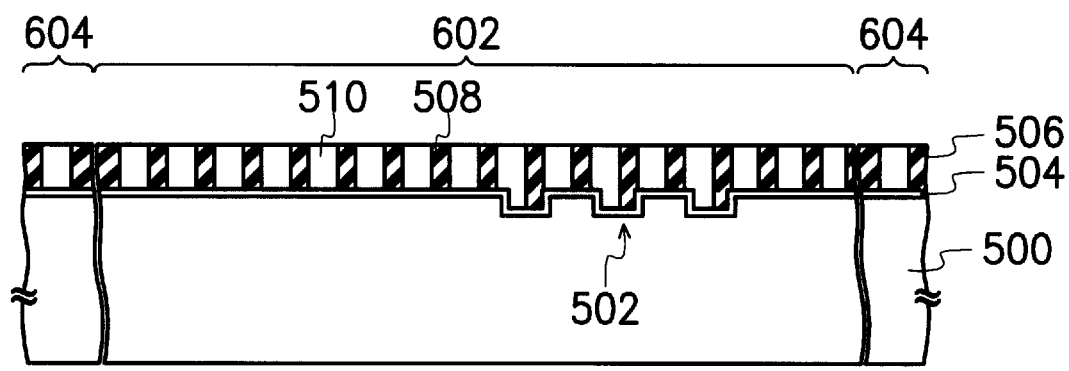
Figure 7:
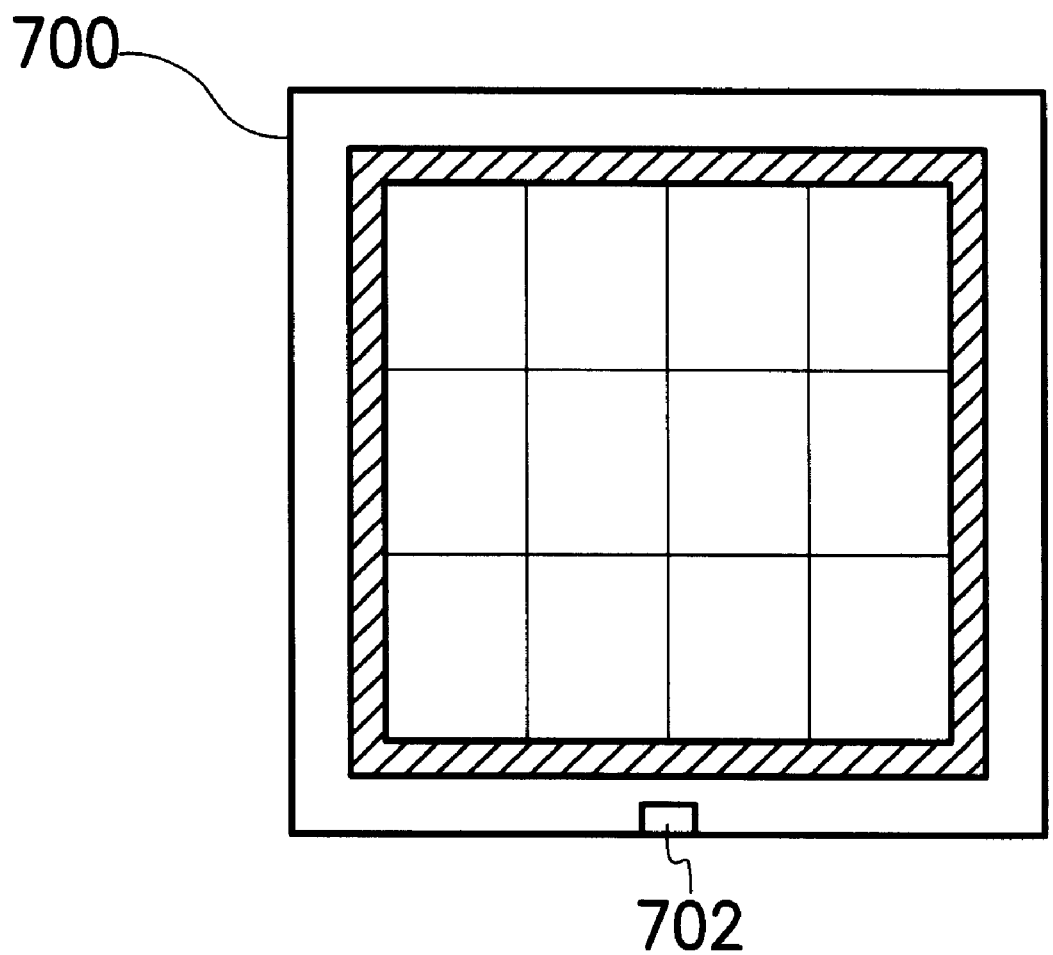
FIG. 7 is a top view of a photomask for patterning out the isolation region in FIG. 5A.

As shown in FIGS. 5B and 7, an exposure process is carried out. FIG. 7 is a top view of a photomask for patterning out the isolation region in FIG. 5A. The pattern on the photomask 700 is transferred one-by-one to the photoresist layer 506 on the first exposure shots 602 and the second exposure shots 604. Ultimately, a plurality of exposed regions 508 and a plurality of unexposed regions 510 are formed in the photoresist layer 506, wherein the unexposed regions 510 contains a pattern for forming the desired isolation regions.

Note that dimensions of the exposure shot 602 having an alignment mark 502 and dimensions of the exposure shot 604 are identical. Hence, a stepper can operate sequentially to form the exposed regions 508 and unexposed regions 510 on the photoresist layer 506 above the exposure shots 602 and 604 simultaneously. In other words, the alignment mark region 502 of this invention occupies a single die 600a in a die 600 only as shown in FIG. 6. The exposure shot 602 where the die 600a belongs can be exposed in a similar way as other exposure shots (exposure shots 604). Ultimately, the desired patterns are formed in both the die 600a and the other dies 600b without having to expose the die with alignment marks separately in a conventional process.

Figure 5C:
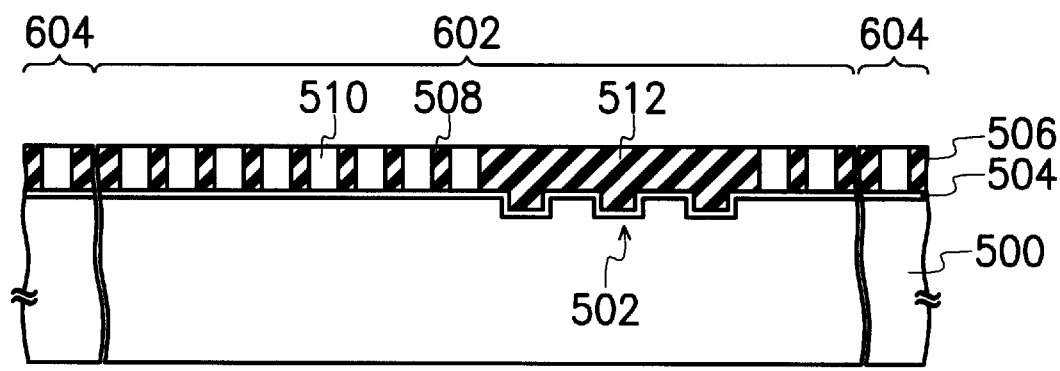

As shown in FIGS. 5C and 6, a second exposure process is carried out to form an exposed region 512 in the photoresist layer 506 above the alignment mark 502. The pattern of the exposed region 512 overlaps with the pattern of the exposed region 508 and the unexposed region 510 above the alignment mark 502. Moreover, the overlapping region covers the entire alignment mark region as well. Preferably, the chromium blocking layer on the periphery of the clearing region 702 above the photomask 700 is aligned with the periphery of the alignment mark 502 so that light is able to pass through the clearing region 702. Thus, a suitable pattern of light is transmitted to the photoresist layer 506 above the die to form the exposed region 512.

Figure 5D:
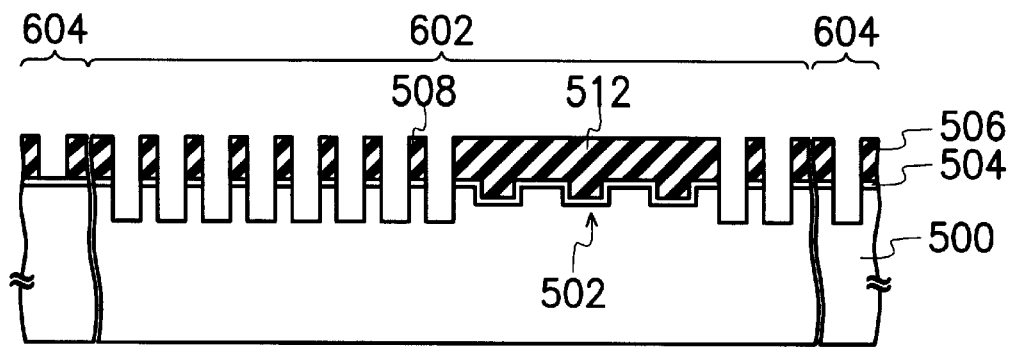

As shown in FIG. 5D, the photoresist layer is developed to remove the photoresist material in the unexposed region 510 and expose a portion of the mask layer 504. The exposed region and the remaining photoresist layer 506 in the exposed region 512 form a desired trench pattern.

Figure 5E:
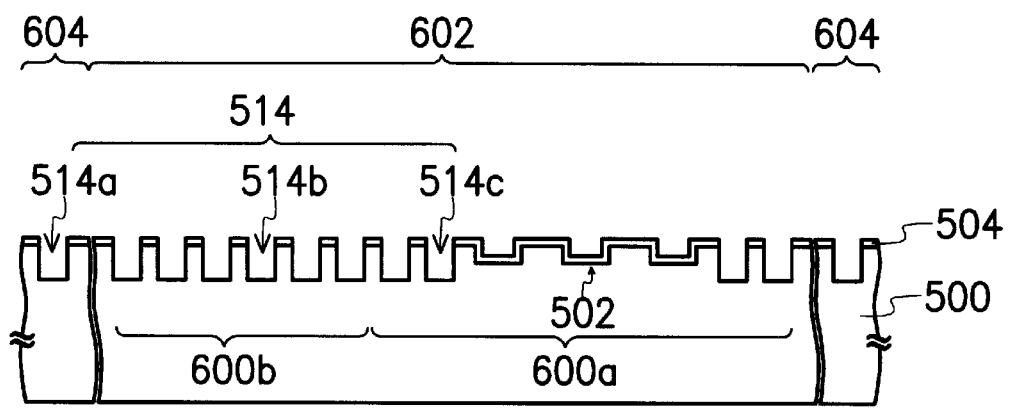

As shown in FIG. 5E, using the photoresist layer 506 as a mask, the exposed mask layer 504 is etched so that the desired trench pattern is transferred from the photoresist layer 506 to the mask layer 504. Since the photoresist layer 506 in the exposed region 512 is retained after the photoresist development, a portion of the mask layer 504 remains above the alignment mark 502 after the etching the mask layer 504. Consequently, the alignment mark 502 is protected against any subsequent etching operations.

The photoresist layer 506 is removed. Using the mask layer 504 as a mask, an etching operation such as a reactive ion etching is carried out to remove a portion of the exposed substrate 500 and form a trench region 514. According to the location in the trench region 514, trenches can be divided into trenches 514a, 514b and 514c. The trenches 514a are formed inside the exposure shot 604 to serve as isolation regions for circuit devices. The trenches 514b are formed on the die 600b in the exposure shot 602 to serve as isolation regions for circuit devices. The trenches 514c are formed on the empty region around the periphery of the alignment mark 502 on die 600a inside the exposure shot 602. These trenches 514c serve to even out the polishing rate in a subsequent polishing operation.

Figure 5F:
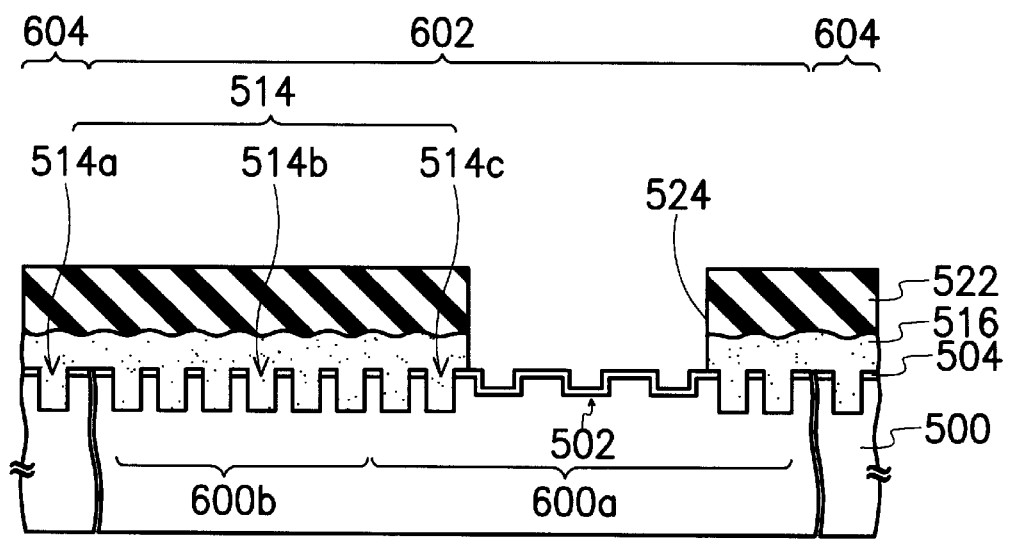

As shown in FIG. 5F, an insulation layer 516 is formed over the substrate 500 covering the mask layer 504 and filling the trenches 514. The insulation layer 516 can be a silicon oxide layer formed, for example, by sub-atmospheric pressure chemical vapor deposition (SACVD) or high-density plasma chemical vapor deposition (HDPCVD). The insulation layer 516 is preferably formed by SACVD using tetraethyl-orthosilicate (TEOS) as a gaseous reactant. To densify the insulation layer 516, the silicon oxide layer is heated up to 1000° C. for about 10 to 30 minutes.

After the insulation layer 516 is formed, a photoresist layer 522 is formed on the insulation layer 516. The photoresist layer 522 has an opening 524 above the alignment mark 502 to expose the insulation layer 516 above the alignment mark 502. The photoresist layer 522 having the opening 524 can be formed by the following exemplary steps. A positive photoresist layer is formed over the substrate 500. The chromium blocking layer on the periphery of the clearing region 702 above the photomask 700 of FIG. 7 is aligned with the periphery of the alignment mark 502 so that light is able to pass through the clearing region 702. Thus, a suitable pattern of light is transmitted to the positive photoresist layer. A developing step is performed to form a photoresist layer 522 having the opening 524 on the insulation layer 516. The photoresist layer 522 is used as mask to remove the insulation layer 516 above the alignment mark 502. The alignment mark 502 is thus exposed. The photoresist layer 522 is removed. A polishing operation is carried out to remove the insulation layer 516 above the mask layer 504.

Figure 8A:
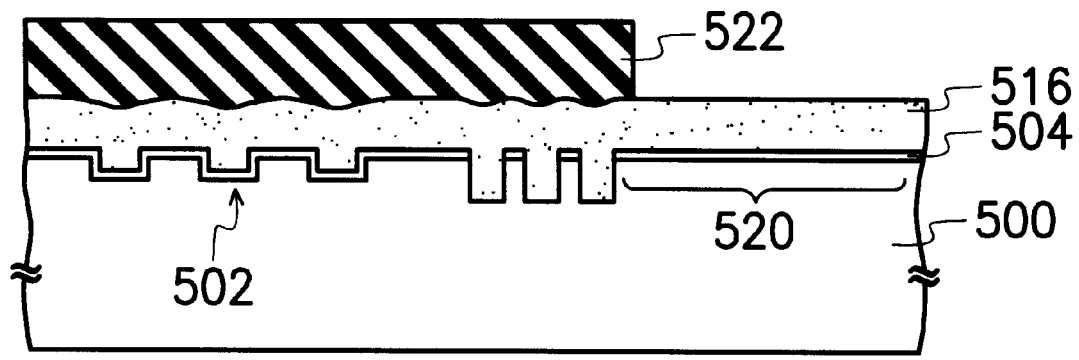
FIGS. 8A and 8B are cross-sectional views showing an alternative method of forming a shallow trench isolation structure according to this invention.
Figure 8B:
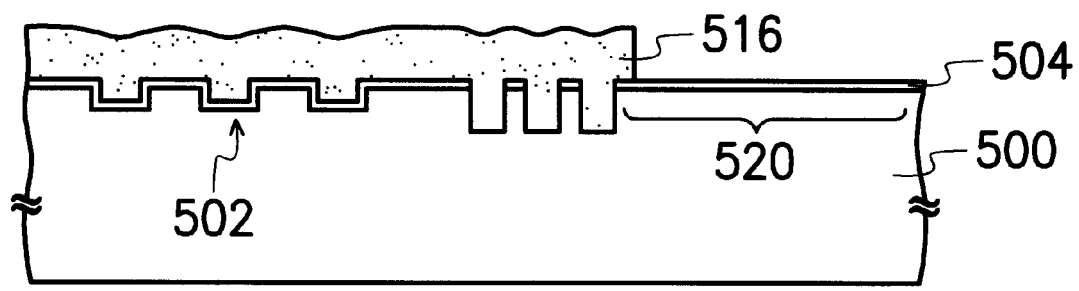

One point needs to be concerned is that, if there is a large empty region between neighboring trenches (the desired isolation region) as shown in area labeled 520 in FIG. 8A, the photoresist layer 522 of the empty region 520 can be exposed via a exposure step while simultaneously forming the photoresist layer 522 on the insulation layer 516. The pattern of the clearing region 702 is then transfer onto the photoresist layer. Then, through a developing step, the photoresist layer 522 is left to expose not only the insulation layer 516 above the alignment mark 502 but also the insulation layer 516 above the empty region 520, as shown in FIG. 8B.

Figure 5G:
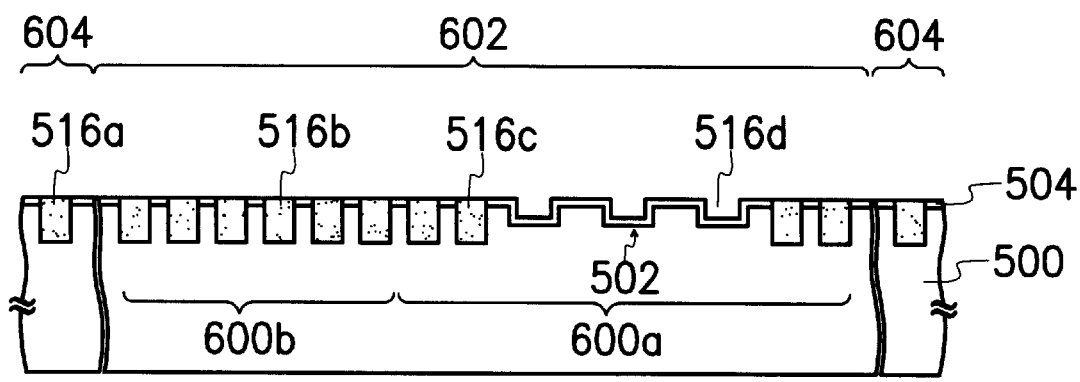

As shown in FIG. 5G, after the photoresist layer 522 is removed, a chemical-mechanical polishing operation is carried out to remove the insulation layer 516 above the mask layer 504. Ultimately, insulation layers 514a, 514b and 514c remain inside the trenches 514a, 514b and 514c respectively. The insulation layer 516a and the insulation layer 516b serve as device isolator while the insulation layer 516c serves as dummy isolator.

Since dimensions of the exposure shots 602 and dimensions of the exposure shots 604 are identical, trenches 514c, 514b and 514a are patterned out using identical photomask 700 (shown in FIG. 7). Hence, the density of trenches in the exposure shot 602 and the density of trenches in the exposure shot 604 are nearly identical. In the process of removing the insulation layer 516 above the mask layer 504 by chemical-mechanical polishing, the insulation layer 516 is removed evenly so that ultimately no residual insulation layer remains on top of the mask layer 504.

Figure 5H:
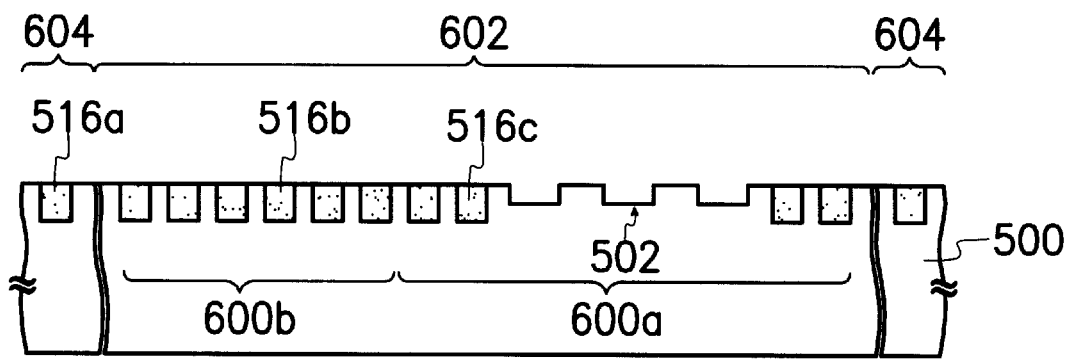

As shown in FIG. 5H, the mask layer 504 is removed to retain the insulation layers 516a, 516b and 516c in respective trenches 514a, 514b and 514c. The mask layer 504 is removed by, for example, wet etching. If the mask layer 504 is composed of a pad oxide layer and a silicon nitride layer while the insulation layer 516d is a silicon oxide layer, hot phosphoric acid can be applied to remove the silicon nitride layer and then hydrofluoric acid solution can be applied to remove the pad oxide layer.

In summary, the advantages of this invention include:

1. In this invention, a negative photoresist layer is formed over the substrate. Hence, the chromium film on the periphery of the clearing region on the photomask can be made to align with the periphery of the alignment mark region. Light is able to pass through the clearing region and transfer the pattern to the die so that an exposed region is formed above the alignment mark. Because position and dimensions of the exposed region depends on the chromium blocking layer of the photomask instead of the non-transparent blade on the stepper, diffraction of light can be prevented. Hence, the pattern of the clearing region on the photomask can be accurately transferred to the photoresist layer.

2. The exposure shot having an alignment mark has dimensions identical to other exposure shots. Hence, in carrying out an exposure, the desired pattern is formed in the exposure shot having the alignment mark as long as exposures are carried out by the stepper sequentially. In other words, the exposure is carried out once to form the exposure shots containing an alignment mark. Compared with the conventional multi-step exposure, the method of this invention is faster. Thus, the invention is capable of increasing throughput, reducing non-transparent blade wear of the stepper and lowering production cost.

3. In this invention, dummy isolation regions are formed around the peripheral region of the alignment mark so that the density of trenches in the first exposure shot with the alignment mark and other second exposure shots are almost identical. Thus, a uniform polishing rate is provided in subsequent chemical-mechanical polishing operation.

4. Furthermore, whether the alignment mark is in the middle of the chip or on one side close to a neighbor die, one exposure is all that is required to form the dummy isolation region pattern around the alignment mark. Consequently, the alignment mark can be positioned in the middle of a die so that the effect of the alignment mark on peripheral dies is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a semiconductor pattern, comprising the steps of:

providing a chip having a plurality of dies thereon, wherein the dies are grouped into a plurality of first exposure shots and a plurality of second exposure shots;

forming an alignment mark in one of the dies of the first exposure shots;

forming a waiting-for-patterning layer over the chip;

forming a negative photoresist layer over the waiting-for-patterning layer;

conducting a first exposure to form a plurality of first exposed regions and a plurality of unexposed regions one-by-one in the negative photoresist layer above the first exposure shots and the second exposure shots;

conducting a second exposure process to form a second exposed region in the negative photoresist layer above the alignment mark, wherein the second exposed region overlaps with the first exposed region and the unexposed region above the alignment mark and an overlapping region completely covers the alignment mark region, wherein the second exposure includes transferring the pattern of a clearing region on a photomask to the negative photoresist layer above the alignment marks to form the second exposed regions;

performing a first developing step on the negative photoresist layer to remove the negative photoresist above the unexposed region so that a portion of the waiting-for-patterning layer is exposed;

removing a portion of the waiting-for-patterning layer to form a pattern on the waiting-for patterning layer using the negative photoresist layer as a mask; and removing the negative photoresist layer.

2. The method of claim 1, wherein the alignment mark is formed in the middle of a chip.

3. The method of claim 1, wherein the first exposure shots and the second exposure shots has identical dimensions.

4. The method of claim 1, wherein the step of conducting the first exposure includes transferring the pattern from a photomask to the negative photoresist layer above the first exposure shots and the second exposure shots one-by-one so that first exposed regions and unexposed regions are formed over the chip.

5. A method of forming a semiconductor pattern, comprising the steps of:

providing a substrate having a plurality of dies thereon so that the substrate is divided into a plurality of first exposure shots and a plurality of second exposure shots, wherein the die regions inside each first exposure shot can be further divided into first dies and second dies;

forming an alignment mark in the first die inside the first exposure shot;

forming a mask layer over the substrate;

forming a negative photoresist layer over the mask layer;

conducting a first exposure to form a plurality of first exposed regions and a plurality of unexposed regions one-by-one in the negative photoresist layer above the first exposure shots and the second exposure shots, wherein the unexposed regions includes a plurality of trench patterns;

conducting a second exposure to form a second exposed region in the negative photoresist layer above the alignment mark, wherein the second exposed region overlaps with the trench patterns of the first exposed region and the unexposed region above the alignment mark and the overlapping region completely covers the alignment mark region, wherein the second exposure includes transferring the pattern of a clearing region on a photomask to the negative photoresist layer above the alignment marks to form the second exposed regions;

developing the negative photoresist layer to remove the negative photoresist in the unexposed region so that the negative photoresist layer forms trench patterns, wherein the trench patterns expose a portion of the mask layer;

removing a portion of the mask layer to form trench patterns on the mask layer using the negative photoresist layer as an etching mask;

removing the negative photoresist layer;

removing a portion of the substrate to form a plurality of trenches in the dies of the first exposure shots and the second exposure shots using the mask layer as an etching mask;

forming an insulation layer over the dies that covers the mask layer and fills the trenches;

removing the insulation layer above the mask layer; and removing the mask layer so that the insulation layers inside the trenches on the die of the second exposure shot and the second die of the first exposure shot form a plurality of isolation regions, and the insulation layers inside the trenches on the first die of the first exposure shot form a plurality of dummy isolation regions.

6. The method of claim 5, wherein the first alignment mark is formed in the middle of the substrate.

7. The method of claim 5, wherein the first exposure shots and the second exposure shots has identical dimensions.

8. The method of claim 5, wherein the step of conducting the first exposure includes transferring the pattern on the photomask one-by-one to the negative photoresist layer above the first exposure shots and the second exposure shots to form first exposed region and unexposed regions on substrate.

9. The method of claim 5, wherein the step of forming the mask layer includes depositing oxide and silicon nitride in sequence to form a composite layer.

10. The method of claim 5, wherein the step of removing the insulation layer above the mask layer includes chemical-mechanical polishing.

11. The method of claim 10, further comprising removing the insulation layer above the mask layer and the insulation layer above the alignment mark after the step of forming the insulation layer but before the step of chemical-mechanical polishing.

12. The method of claim 11, wherein the step of removing the insulation layer above the mask layer and the insulation layer above the alignment mark comprises:

forming a positive photoresist layer over the insulation layer;

performing a third exposure step to expose the positive photoresist layer on an empty region of the substrate;

performing a fourth exposure step to transfer a pattern of a clearing region on the photomask onto the positive photoresist layer covering above the alignment mark;

performing a second developing step to remove the positive photoresist layer above the alignment mark and the empty region;

removing the insulation layer exposed by the positive photoresist layer to expose the mask layer above the alignment mark and the empty region; and removing the positive photoresist layer.

13. The method of claim 10, further comprising removing the insulation layer above the mask layer after the step of forming the insulation layer but before the step of chemical-mechanical polishing.

14. The method of claim 13, wherein the step of removing the insulation layer above the mask layer comprises:

forming a positive photoresist layer above the insulation layer;

performing a third exposure step and a second exposure step to remove the positive photoresist layer on an empty region of the substrate;

removing the insulation layer exposed by the positive photoresist layer to expose the mask layer of the empty region; and removing the positive photoresist layer.

15. The method of claim 10, further comprising removing the insulation layer above the alignment mark after the step of forming the insulation layer but before the step of chemical-mechanical polishing.

16. The method of claim 15, wherein the step of removing the insulation layer above the mask layer further comprises:

forming a positive photoresist layer over the insulation layer;

performing a third exposure step and a second developing step to transfer a pattern of a clearing region on the photomask onto the positive photoresist layer above the alignment mark;

removing the insulation layer exposed by the positive photoresist layer; and removing the positive layer.

* * * * *